United States Patent
Bouchez et al.

(10) Patent No.: US 9,484,907 B2
(45) Date of Patent: Nov. 1, 2016

(54) DEVICE FOR CONTROLLING AT LEAST ONE TRANSISTOR

(71) Applicant: Valeo Systemes de Controle Moteur, Cergy Saint Christophe (FR)

(72) Inventors: Boris Bouchez, Cergy (FR); Mathieu Grenier, Cergy (FR)

(73) Assignee: Valeo Systemes de Controle Moteur, Cergy-Pontoise (FR)

( * ) Notice: Subject to any disclaimer, the term of this patent is extended or adjusted under 35 U.S.C. 154(b) by 0 days.

(21) Appl. No.: 14/414,188

(22) PCT Filed: Jul. 11, 2013

(86) PCT No.: PCT/FR2013/051664
§ 371 (c)(1),
(2) Date: Jan. 12, 2015

(87) PCT Pub. No.: WO2014/009668
PCT Pub. Date: Jan. 16, 2014

(65) Prior Publication Data
US 2015/0180462 A1    Jun. 25, 2015

(30) Foreign Application Priority Data

Jul. 13, 2012  (FR) .................................. 12 56834

(51) Int. Cl.
*H03K 17/687* (2006.01)
*H03K 17/082* (2006.01)
*H03K 17/16* (2006.01)

(52) U.S. Cl.
CPC ...... *H03K 17/0822* (2013.01); *H03K 17/0828* (2013.01); *H03K 17/166* (2013.01); *H03K 17/168* (2013.01); *H03K 17/687* (2013.01)

(58) Field of Classification Search
CPC .................. H03K 17/04126; H03K 17/063; H03K 17/0822; H03K 17/0826; H03K 17/0828; H03K 17/166; H03K 17/168; H03K 17/601; H03K 17/687; H03K 2217/0036
USPC ......................................................... 327/109
See application file for complete search history.

(56) References Cited

U.S. PATENT DOCUMENTS

| | | | |
|---|---|---|---|
| 5,926,012 A | 7/1999 | Takizawa et al. | |
| 6,459,324 B1 | 10/2002 | Neacsu et al. | |
| 2012/0032709 A1* | 2/2012 | Saotome | H03K 17/04206 327/109 |

FOREIGN PATENT DOCUMENTS

| | | |
|---|---|---|
| EP | 2418776 A1 | 2/2012 |
| FR | 2671241 A1 | 7/1992 |
| WO | 2010/057893 A1 | 5/2010 |

OTHER PUBLICATIONS

International Search Report issued in PCT/FR2013/051664 mailed on Sep. 24, 2013 (6 pages).

*Primary Examiner* — John Poos
*Assistant Examiner* — David Mattison
(74) *Attorney, Agent, or Firm* — Osha Liang LLP

(57) ABSTRACT

A device for controlling at least one transistor is disclosed. The device includes the transistor, which includes a control electrode and two other electrodes, a main control circuit connected to the control electrode of the transistor and configured to control the state of the transistor in a main operating mode, and an auxiliary control circuit configured to inject, in an auxiliary operating mode. An auxiliary current opposed to the current flows between the main control circuit and the control electrode of the transistor.

5 Claims, 3 Drawing Sheets

DEVICE FOR CONTROLLING AT LEAST ONE TRANSISTOR

Figures 1, 2:
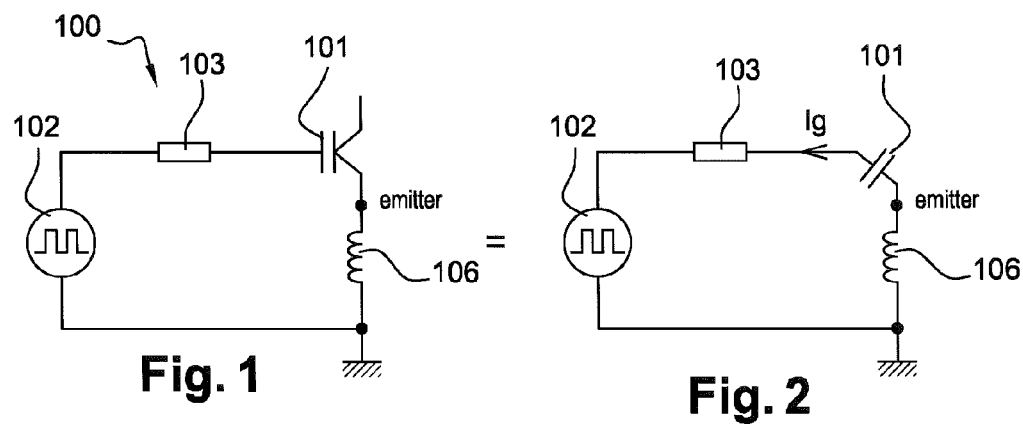

The present invention relates to a device for controlling at least one transistor. Transistors are commonly used for the construction of branches of static converters. These transistors are commonly controlled by a control circuit, also called a "driver", configured to inject a current into the control electrode of the transistor to make it conducting and to enable current to be received from this control electrode when the transistor is cut off. When the transistor is cut off, an overvoltage may appear at its terminals, the voltage at the terminals of the transistor being, for the purposes of the present application, the voltage between the electrodes of the transistor other than the control electrode of the transistor. An example of the appearance of an overvoltage at the terminals of a transistor when the latter is cut off is given below.

When the transistor belongs to a branch that develops a short circuit, the current flowing in this branch increases considerably. It is desirable to cut off the transistor in order to avoid excessive heating of the latter due to the high current flowing in the branch. However, when the transistor is cut off in this way, a considerable overvoltage may appear at its terminals, because the voltage at the terminals of the transistor may become equal to the sum of the voltage of the branch and the voltage at the terminals of parasitic inductances in the transistor. This overvoltage may degrade or even destroy the transistor.

Consequently there is a need to reduce the overvoltage appearing in the transistor when the transistor is cut off, notably in the case where the transistor belongs to a branch of the static converter and the transistor is then cut off when said branch forms a short circuit. Known solutions for reducing this overvoltage consist in:
  limiting the voltage between the electrodes other than the control electrodes of the transistor by means of a high-voltage diode, and by means of a Zener diode and a resistance in series if necessary,
  using a control circuit of the transistor which sets two different values of electrical potential for the control electrode du transistor, namely a first value, corresponding to the switching of the transistor to the conducting state, and a second value, lower than the first, corresponding to the cutting off of the transistor. Since the electrical potential of the control electrode is lower when the transistor is cut off, the overvoltage is reduced,
  providing two different gate resistances between the control electrode and the control circuit, one being used for cutting off the transistor when the branch to which it belongs develops a short circuit, and the other being used for other cases of cut-off, the gate resistance used for cutting off in the case of a short circuit having a higher value than the other gate resistance, in order to limit overvoltages.

None of these solutions achieves a satisfactory compromise among the following factors: cost of the solution, reaction speed, space occupied by the implementation of the solution, and electrical losses caused when the solution is implemented.

There is a need to overcome the drawbacks of the preceding solutions.

The invention is intended to meet this need, and it achieves this object, according to one of its aspects, by means of a device for controlling at least one transistor, comprising:

said transistor, this transistor comprising a control electrode and two other electrodes,
a main control circuit connected to the control electrode of the transistor and configured so as to control the state of the transistor in a main operating mode, and
an auxiliary control circuit configured to inject, in an auxiliary operating mode, an auxiliary current opposed to the current flowing between the main control circuit and the control electrode of the transistor.

The invention makes use, notably, of the fact that, when the transistor is cut off, it acts as a capacitor between the control electrode and one of the other electrodes of the transistor. The reduction of the current flowing from the control electrode toward the main control circuit as a result of the injection of the auxiliary current makes it possible to reduce the temporal variation of the current flowing between the other electrodes of the transistor, and consequently the overvoltage in the transistor, which is partly due to parasitic inductances.

Therefore the injection of auxiliary current makes it possible to slow down, in the temporal sense, the variation of the current flowing between the electrodes of the transistor other than its control electrode.

The auxiliary control circuit according to the invention can provide fast reaction when the appearance of high voltages is detected at the terminals of a parasitic inductance or inductances of the transistor, without occupying a large amount of space in the device, without incurring high costs, and without causing high losses.

Furthermore, the auxiliary control circuit can be compatible with conventional drivers and can be used to supplement the latter.

For the purposes of the present invention, the term "connected" without further qualification may signify "directly connected", that is to say without any intermediate component, or "indirectly connected", that is to say via one or more intermediate components.

In the main operating mode, it is only the main control circuit that can interact with the transistor, whereas, in the auxiliary operating mode, the auxiliary control circuit also interacts with the transistor.

It is possible for the use of the auxiliary mode to be dependent on the presence of a predetermined condition. The predetermined condition may relate to the value of the time derivative of the current flowing between the electrodes of the transistor other than the control electrode, or more precisely to the result of the comparison of this value with a threshold value.

The auxiliary control circuit may be configured to inject the auxiliary current when current flows from the control electrode of the transistor toward the main control circuit. This case corresponds to the cutting off of the transistor. This cut-off may be carried out in a controlled way.

If this value of the time derivative of the current flowing between the electrodes of the transistor other than the control electrode is greater than the threshold value, the auxiliary operating mode may be used, by injecting the auxiliary current. If the transistor forms part of a branch of a static converter, the threshold value may be chosen so as to be exceeded when the transistor is cut off after a short circuit has developed in said branch. Because the threshold value has been exceeded, harmful overvoltages may appear at the terminals of the transistor when the latter is cut off.

In a variant, the threshold value may be chosen so as to be exceeded when the transistor is cut off without the preliminary development of a short circuit in the branch to which it belongs.

The device may include an element for detecting the presence of the predetermined condition. This element is, for example, an element for measuring the voltage across the terminals of the parasitic inductance of another electrode of the transistor. The measurement of this voltage, which is a linear image of the time derivative of the current flowing in this electrode, may enable the aforementioned comparison to be made. The parasitic inductance in question has, for example, a value of the order of several nH.

The device may comprise a control resistance (similar to the gate resistance mentioned above) interposed between the control electrode and the main control circuit. The auxiliary control circuit may be arranged so as to inject the auxiliary current into a node interposed between the control resistance and the control electrode. By contrast with the known solutions, no other control resistance for specific cases of cut-off of the transistor is provided, for example.

The device may comprise a power amplifier circuit, notably of the "push-pull" type, positioned between the main control circuit and the control electrode of the transistor, the auxiliary control circuit being arranged in such a way that the injected auxiliary current flows through the power amplifier circuit when the auxiliary operating mode is used. Because of the position of the auxiliary control circuit upstream of the power amplifier circuit, the components of this auxiliary control circuit may be designed for lower power and their cost may be lower.

The auxiliary control circuit may be configured to lock the value of the time derivative of the current flowing between the electrodes of the transistor other than the control electrode around a setpoint value. This setpoint value may be chosen to prevent degradation of the transistor. The setpoint vale may be lower than or equal to the threshold value, which may or may not be chosen so as to be exceeded when the transistor is cut off after the branch has developed a short circuit, or when the transistor is cut off regardless of the development of this short circuit.

The auxiliary control circuit comprises, for example:
  a first resistance in series between one of the other electrodes of the transistor and a transistor forming part of the element for detecting the presence of the predetermined condition, and
  a second resistance in series between said transistor forming part of the element for detecting the presence of the predetermined condition and a voltage source, the terminal of this second resistance connected to the transistor of the element for detecting the presence of the predetermined condition being additionally connected to the control electrode of a transistor through which the auxiliary current flows when the latter is injected.

The locking may be achieved by the choice of the value of the ratio between the first and the second resistance. This ratio is, for example, in the range from one to ten, being equal to five, for example.

In a variant, the device may not include a power amplifier circuit of this type.

In a further variant, the device may comprise a power amplifier circuit, notably of the "push-pull" type, positioned between the main control circuit and the control electrode, the auxiliary control circuit being arranged so as to inject current between this power amplifier circuit and the transistor when the auxiliary operating mode is used.

The transistor may be of the IGBT type, the control electrode being the gate. In this case, when the transistor is cut off, a capacitor may be considered to be present between the gate and the emitter of the transistor. To decide whether the predetermined condition is met, the temporal variation of the current in the parasitic inductance of the emitter can be monitored.

In this case, and if the transistor forms part of a branch comprising two transistors in series, the parasitic inductance of the emitter is as follows:
  for a transistor in the lower part of the branch, it is the parasitic inductance between the control ground of the transistor (also called the "control emitter of the transistor") and the power ground,
  for a transistor in the upper part of the branch, it is the parasitic inductance between the control ground of the transistor and the collector of the other transistor.

In a variant, the transistor may be a field-effect transistor, the control electrode being the gate. In this case, when the transistor is cut off, a capacitor may be considered to be present between the gate and the source of the transistor. To decide whether the predetermined condition is met, the temporal variation of the current in the parasitic inductance of the source can be monitored.

In this case, and if the transistor forms part of a branch comprising two transistors in series, the parasitic inductance of the source is as follows:
  for a transistor in the lower part of the branch, it is the parasitic inductance between the control ground of the transistor (also called the "control source of the transistor") and the power ground,
  for a transistor in the upper part of the branch, it is the parasitic inductance between the control ground of the transistor and the drain of the other transistor.

In a variant, the transistor may be a bipolar transistor, the control electrode being the base. In this case, when the transistor is cut off, a capacitor may be considered to be present between the base and the emitter of the transistor. To decide whether the predetermined condition is met, the temporal variation of the current in the parasitic inductance of the emitter can be monitored.

In this case, and if the transistor forms part of a branch comprising two transistors in series, the parasitic inductance of the emitter is as follows:
  for a transistor in the lower part of the branch, it is the parasitic inductance between the control ground of the transistor (also called the "control emitter of the transistor") and the power ground,
  for a transistor in the upper part of the branch, it is the parasitic inductance between the control ground of the transistor and the collector of the other transistor.

The auxiliary control circuit may comprise an electrical energy source for generating the auxiliary current. This electrical energy source may or may not form part of the auxiliary control circuit, being for example shared with the main control circuit.

The device may be used to control a plurality of transistors, for example a plurality of transistors belonging to the same branch or a plurality of transistors in parallel in the same branch or a plurality of transistors belonging to different branches.

The static converter to which the branch belongs may form part of an on-board circuit on a vehicle, for example a hybrid or electric vehicle. This static converter may form part of a charging circuit for a high voltage battery of the vehicle. In a variant, it may form part of a circuit supplying power to the stator or rotor of the electric motor of the vehicle. In a further variant, it may form part of a circuit which charges the high voltage battery and also supplies power to the stator of the electric motor, an example of this type of circuit being disclosed in application WO 2010/057893.

The static converter may be a DC to DC voltage converter or a DC to AC voltage converter, also called a rectifier or inverter, depending on its use.

In another of its aspects, the invention also proposes a method for controlling a transistor comprising a control electrode and two other electrodes, by means of a device comprising, in addition to the transistor:
- a main control circuit connected to the control electrode of the transistor and configured so as to control the state of the transistor in a main operating mode, and
- an auxiliary control circuit configured to inject, in an auxiliary operating mode, an auxiliary current into the control electrode of the transistor to oppose the current flowing between the main control circuit and the control electrode of the transistor, the auxiliary operating mode being used when a predetermined condition is present.

The predetermined condition may relate to the value of the time derivative of the current flowing between the electrodes of the transistor other than the control electrode, or more precisely to the result of the comparison of this value with a threshold value.

The threshold value may be chosen so as to be exceeded by the value taken by the time derivative of the current flowing between the electrodes of the transistor other than the control electrode when the transistor is cut off after a short circuit has developed in said branch of a static converter to which the transistor belongs. This branch may comprise at least one switching cell in series with the transistor. In this case, the auxiliary circuit is used for cutting off the transistor after a short circuit in the branch. In a variant, the threshold value may be chosen so as to be exceeded by the value taken by the time derivative of the current flowing between the electrodes of the transistor other than the control electrode when the transistor is cut off, without a short circuit necessarily having developed in said branch. In this case, the auxiliary circuit may use the auxiliary mode for each cut-off of the transistor, if there is a risk that the transistor may become degraded.

In order to detect the predetermined condition, it is possible, for example, to measure the voltage at the terminals of the parasitic inductance of one of the electrodes of the transistor other that the control electrode, for example the emitter in the case of a bipolar or IGBT transistor, or the source in the case of a field-effect transistor.

Some or all of the characteristics mentioned in relation to the above device are applicable to the control method. More specifically, the static converter may be a DC to DC voltage converter or a DC to AC voltage converter.

Figure 3:
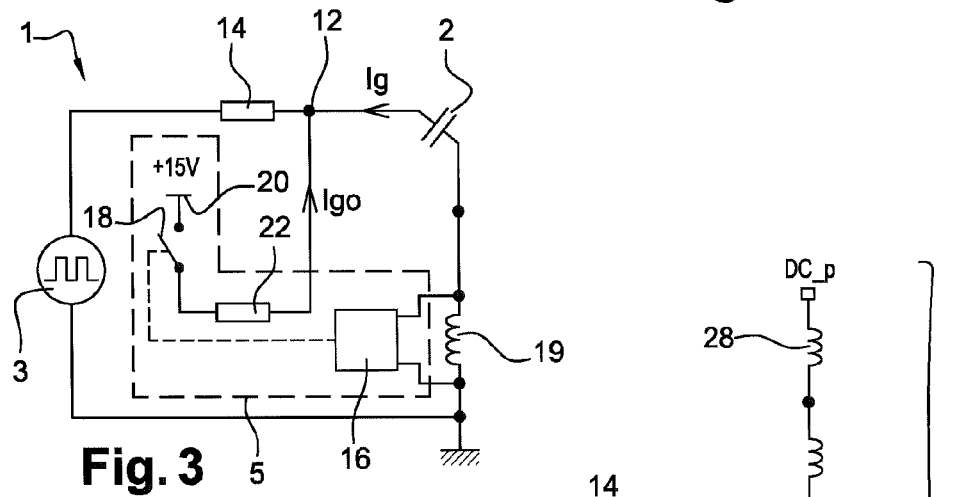
Figure 4:
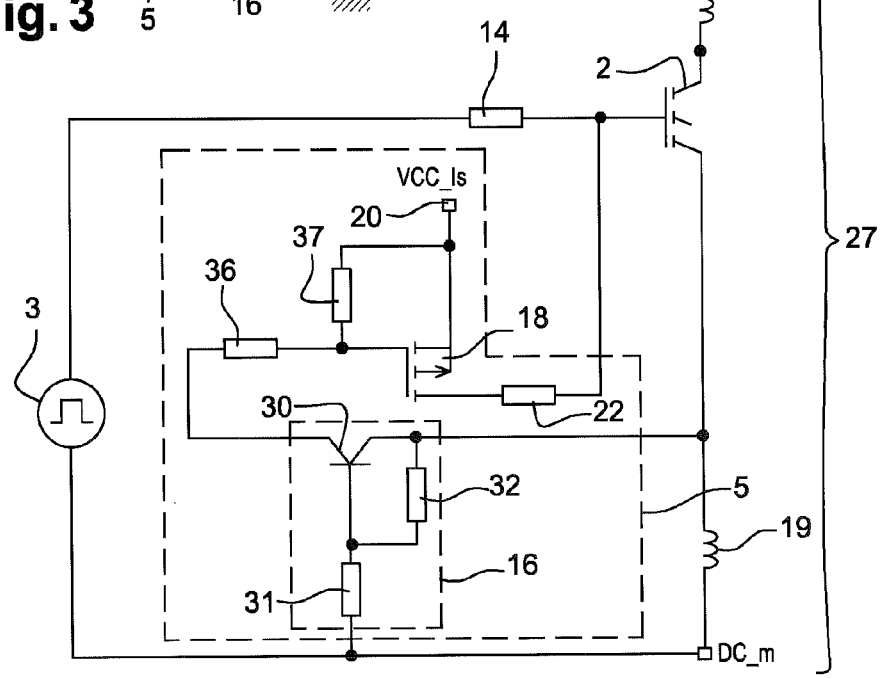
Figure 5:
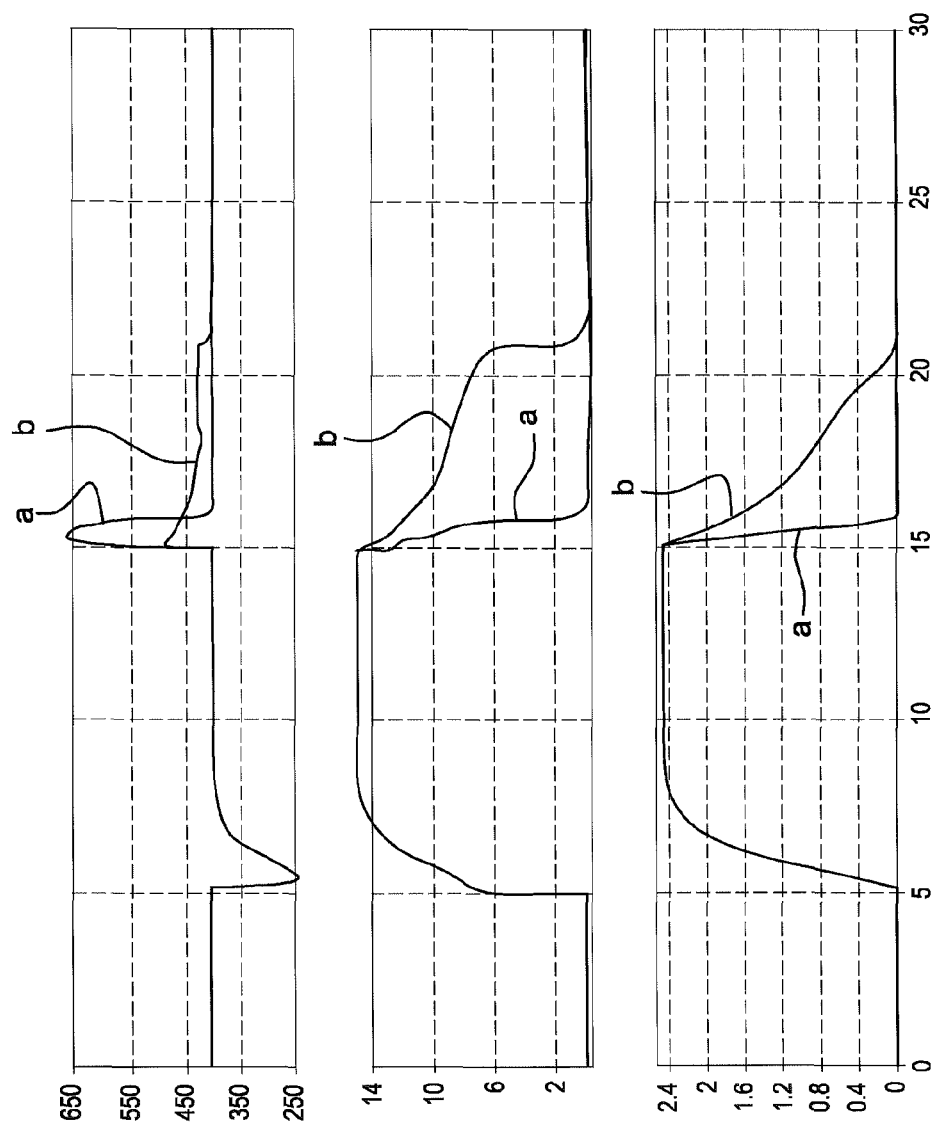
Figure 6:
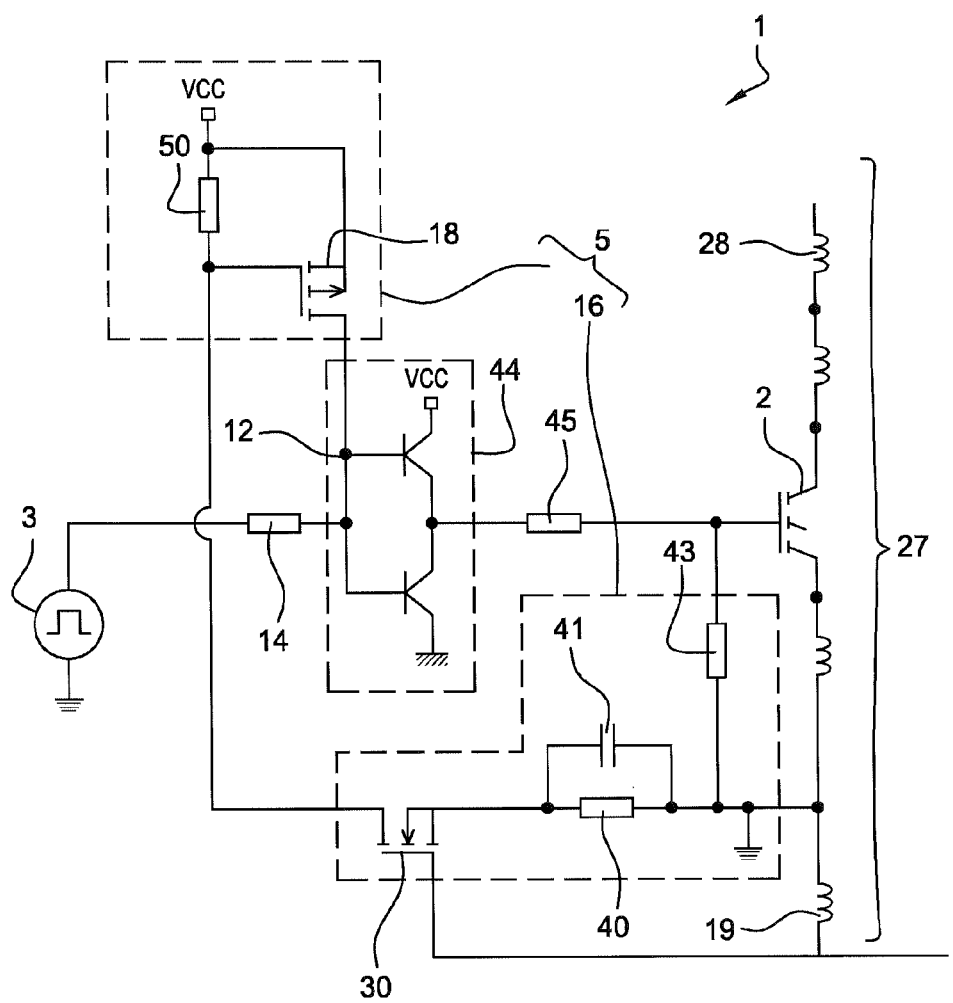

The invention will be more readily understood by reading the following description of exemplary embodiments thereof, and by examining the attached drawing, in which:

FIG. 1 shows in a schematic manner a control device for a transistor according to the prior art, FIG. 2 shows, in a schematic manner, an equivalent model of the transistor of the device of FIG. 1 when the transistor is cut off, FIG. 3 shows in a schematic manner a control device according to the invention, FIG. 4 shows an exemplary embodiment of the device according to FIG. 3, FIG. 5 show different electrical quantities associated with the transistor of the device according to FIG. 1 and of the device according to FIG. 4, and FIG. 6 shows another exemplary embodiment of the device according to FIG. 3.

FIG. 1 shows an example of a device 100 for controlling at least one transistor 101 according to the prior art. In addition to the transistor 101 which in this case is an IGBT type transistor, the device 100 comprises a main control circuit 102, sometimes known by the English term "driver", configured to control the state of the transistor 101. A gate resistance 103 is interposed between the main control circuit 102 and the gate of the transistor 101, the current flowing between the gate and the main control circuit 102 passing through this gate resistance 103.

FIG. 1 also shows the parasitic inductance 106 of the emitter of the transistor 101.

FIG. 2 shows the equivalent model that may be used between the emitter and the gate of the transistor 101 when the transistor 101 is cut off. A current $i_g$ then flows from the gate of the transistor 101 toward the main control circuit 102, this condition corresponding to a discharge of the capacitor according to the model of FIG. 2.

The solution proposed by the invention in response to the drawbacks of the prior art solutions will now be described in a schematic manner with reference to FIG. 3.

FIG. 3 shows a device 1 for controlling at least one transistor 2. In the example described here, this transistor forms part of a branch of a static converter, for example a DC to DC voltage converter or a DC to AC voltage converter, more commonly known as an inverter or a rectifier. A freewheel diode (not shown) may be fitted in antiparallel with the transistor 2 to form a switching cell for the branch.

In the example described here, the transistor 2 is of the IGBT type and comprises a control electrode, being the gate, and two other electrodes, being the emitter and the collector.

In the example considered here, all the transistors of the branch may simultaneously be in the conducting state, in such a way that the branch may develop a short circuit. The current flowing between the electrodes of transistor 2 other than the control electrode may then increase considerably.

The device 1 further comprises:
- a main control circuit 3 connected to the gate of the transistor 2 and configured so as to control the state of the transistor in a main operating mode, and
- an auxiliary control circuit 5, shown in a highly schematic manner in FIG. 3.

The circuit 5 is configured to use an auxiliary operating mode by injecting an auxiliary current $i_{g0}$ into the gate of the transistor 2, as described below, in a node 12 positioned, in the example of FIG. 3 between the gate of the transistor 2 and a control resistance 14 fitted in series with the main control circuit 3.

As shown in FIG. 3, the auxiliary control circuit 5 may comprise an element 16 configured to detect the presence of a predetermined condition before the auxiliary operating mode is used. In the example described here, this predetermined condition relates to a comparison between the value of the time derivative of the current in the emitter of the transistor and a threshold value. This predetermined condition makes it possible, notably, to determine whether the cut-off of the transistor 2 has occurred when a short circuit has developed in the branch of which this transistor 2 forms a part, the appearance of this short circuit being indicated by an abrupt change in the time derivative of the current flowing between the emitter and the collector of the transistor 2 when the transistor 2 is cut off. Thus the threshold value can be chosen in such a way that this cut-off of the transistor is detected when a short circuit has developed.

In the present case, the detection element 16 measures the voltage at the terminals of the parasitic inductance 19 of the transistor 2. If the transistor is located in the lower part of the converter branch, this voltage appears between the control ground of the transistor 2 and the power ground of the transistor 2, these two grounds being accessible on the transistor module used.

According to the comparison made by the element 16 between the measured value and a threshold value of voltage, a command is sent to a switch 18 when the transistor 2 is cut off, to enable or prevent the injection of the auxiliary current $i_{g0}$. This switch 18 is, for example, fitted in series between an electrical energy source 20 and the node 12. The electrical energy source 20 delivers, for example, a voltage of 15 V, and in the described example it forms part of the main control circuit 3.

If necessary, a resistance 22 may also be incorporated into the auxiliary control circuit 5.

The current $i_{g0}$ injected into the node 12 is chosen so that it opposes the current $i_g$ flowing in the gate of the transistor 2. Thus the current flowing in the gate of the transistor ceases to be $i_g$ and becomes $i_g - i_{g0}$. The amplitude of the current $i_{g0}$ may be in the range from 1 A to 10 A.

When the transistor 2 is cut off, that is to say when the capacitor according to the model of FIG. 2 or 3 is discharged, the current flowing in the gate of the transistor 2 is reduced, thereby also reducing the temporal variation of the current flowing between the emitter and the collector of the transistor 2. As mentioned previously, this temporal variation gives rise to overvoltages which may degrade the transistor 2. Thus the overvoltages appearing at the terminals of the transistor are reduced when the latter is cut off. FIG. 4 shows the structure of an example of the device 1. The transistor 2 belongs to a branch 27 whose other transistor 28 is shown in the form of an inductance, so that the establishment of the short circuit in the branch 27 depends solely on the state of the transistor 2.

As shown, the element 16 comprises a bipolar transistor 30 and two resistances 31 and 32. In this example, the transistor 30 is of the NPN type. Its emitter is directly connected to the emitter of the transistor 2, while its base is directly connected to a first end of the resistance 31, whose second end is connected to an output terminal of the transistor 2, while the latter output terminal may or may not be connected to ground, depending on the position of the transistor 2 in the branch of the static converter. The resistance 32 is fitted between the base of the transistor 30 and its emitter.

Thus the element 16 makes it possible to measure the voltage at the terminals of the parasitic inductance 19 present between the emitter of the transistor 2 and its output terminal. If the voltage at the terminals of the inductance 19 becomes greater than the threshold value, the transistor 30 changes state and becomes conducting, and this change of state is perceived by the switch 18, causing the latter to close so as to allow the current $i_{g0}$ to be injected from the electrical energy source 20 into the node 12.

In the example of FIG. 4, the switch 18 is a field-effect transistor of the MOSFET type, and is associated with two resistances 36 and 37. The resistance 36 is interposed between the gate of the transistor 18 and the collector of the bipolar transistor 30, while the resistance 37 is interposed between the gate and the source of the transistor 18. The electrical energy source 20 is connected to the source of the transistor 18. The drain of the transistor 18 is also connected to the resistance 22.

The following numerical values, for example, are chosen for the elements of the control device 1 of FIG. 4. The resistances 14, 22, 31, 32, 36 and 37 have impedances of 4.7Ω, 1Ω, 100Ω, 1 kΩ, 4.7Ω and 1 kΩ respectively. The electrical energy source 20 supplies a voltage of about 15 V. The parasitic inductance 19 has, for example, a value of 2.7 nH.

FIG. 5 shows:
in its upper part, the variation of the voltage, in V, between the collector and the emitter of the transistor 2,
in its central part, the variation of the voltage, in V, between the gate and the emitter of the transistor 2,
in its lower part, the variation of the current, in kA, flowing from the collector toward the emitter of the transistor 2.

In the example shown here, the transistor 2 is conducting between the instants 5 µs and 15 µs and is caused to be cut off at 15 µs. Because of the model chosen for the other transistor 28, a short circuit is established in the branch 27 between the instants 5 µs and 15 µs.

In each part of FIG. 5, the curve a) corresponds to the device 100 according to FIG. 1, while the curve b) corresponds to the device 1 according to FIG. 4. As can be seen in the lower part of FIG. 5, the reduction of the current flowing between the emitter and the collector of the transistor 2 because of the latter's change to the cut-off state is much slower when the auxiliary control circuit 5 according to the invention injects the auxiliary current $i_{g0}$ into the control electrode of the transistor 2. Thus, as shown in the upper part of FIG. 5, the overvoltage appearing at the instant 15 µs between the collector and the emitter of the transistor 2 is significantly reduced.

For example, it can be seen in the upper part of this FIG. 5 that the overvoltage according to the curve a) is of the order of more than 250 V, while it is only of the order of about 80 V according to the curve b). Thus this overvoltage and the negative consequences associated therewith are considerably reduced.

Another exemplary embodiment of the control device 1 shown in FIG. 3 will now be described with reference to FIG. 6. In this case, the detection element 16 comprises a field-effect transistor 30 of the MOSFET type whose gate is connected to the output terminal of the transistor 2, whose source is connected to the emitter of the transistor 2 via a filter formed by a parallel arrangement of a first resistance 40 and a capacitor 41.

Additionally, a resistance 43 is connected between the gate of the transistor 2 and its emitter.

In this example, the device 1 comprises a power amplifier of the push-pull type 44. The circuit 44 is formed in a known way, using a PNP transistor and an NPN transistor having the same gain in a common collector circuit. The bases of these transistors are also directly connected. In this example, the resistance 14 is interposed between the main control circuit 3 and the bases of the transistors of the circuit 44, while another resistance 45 is interposed between the push-pull circuit 44 and the transistor 2. The switch 18 of the auxiliary control circuit 5 is, in this example, a MOSFET transistor whose gate is connected to the drain of the transistor 30 of the detection element 6, whose source is connected to the electrical energy source 20 and whose drain is connected to the bases of the transistors of the circuit 44.

A second resistance 50 is associated with the transistor MOSFET 18, the latter connecting the gate of this transistor 18 to its source.

In this example, the threshold value is not chosen so as to be exceeded when the transistor 2 is cut off after a short circuit in the branch 27. It may be exceeded when the transistor 2 is cut off without the previous development of a short circuit in the branch 27.

The following numerical values, for example, are chosen for the elements of the control device 1 of FIG. 6. The resistances 14, 40, 43, 45 and 50 have impedances of 100Ω, 200Ω, 47 kΩ, 3Ω and 1 kΩ respectively. The electrical energy source provides a voltage of about 15 V. The parasitic inductance 19 has, for example, a value of 2 nH. The capacitor 41 has, for example, a capacitance of 220 pF. In this example, the ratio between the first resistance 40 and the second resistance 50 is five, and this ratio enables the voltage at the terminals of the parasitic inductance 19 to be locked to a value at which the transistor 2 is not degraded.

If the voltage at the terminals of the parasitic inductance 19 is above the threshold value, the transistor 30 becomes conducting, thereby also making the transistor 18 conducting. The current $i_{go}$ can then flow from the source 20 through the transistor 18, the circuit 44 and up to the gate of the transistor 2.

The invention is not limited to the examples described above.

In particular, although the transistor 2 has been described as a transistor of the IGBT type, it may be a field-effect transistor or a bipolar transistor.

Although only one transistor is controlled by the control device 1 in the example described here, a plurality of transistors in the same branch of a static converter could be controlled by the device 1 in order to constrain their cut-off.

The expression "comprising a" is to be understood as being synonymous with the expression "comprising at least one", unless specified otherwise.

The invention claimed is:

1. A device for controlling at least one transistor, comprising:
    said at least one transistor comprising a control electrode and two other electrodes;
    a main control circuit connected to the control electrode of the transistor and configured so as to control the state of the transistor in a main operating mode;
    an auxiliary control circuit configured to inject, in an auxiliary operating mode, an auxiliary current opposed to the current flowing between the main control circuit and the control electrode of the transistor, the auxiliary control circuit comprising:
        a first resistance in series between one of the other electrodes of the transistor and a transistor forming part of the element for detecting the presence of the predetermined condition, and
        a second resistance in series between said transistor forming part of the element for detecting the presence of the predetermined condition and a voltage source, the terminal of this second resistance connected to the transistor of the element for detecting the presence of the predetermined condition being additionally connected to the control electrode of a transistor through which the auxiliary current flows when the latter is injected, wherein the locking is achieved by the choice of the value of the ratio between the first and the second resistance;
    a power amplifier circuit of the "push-pull" type, positioned between the main control circuit and the control electrode of the transistor, the auxiliary control circuit being arranged so that the injected current flows through the power amplifier circuit when the auxiliary operating mode is used under presence of a predetermined condition relating to a value of a time derivative of a current flowing between the electrodes of the transistor other than the control electrode; and
    an element for detecting the presence of the predetermined condition by measuring a voltage at the terminals of a parasitic inductance of one of the electrodes other than the control electrode of the transistor.

2. The device as claimed in claim 1, comprising a control resistance interposed between the control electrode of the transistor and the main control circuit, the auxiliary control circuit being arranged so as to inject the auxiliary current into a node interposed between the control resistance and the control electrode of the transistor.

3. The device as claimed in claim 1, the auxiliary control circuit being configured to lock the value of the time derivative of the current flowing between the electrodes of the transistor other than the control electrode around a setpoint value.

4. A method for controlling a transistor comprising a control electrode and two other electrodes, by a device comprising, in addition to the transistor:
    a main control circuit connected to the control electrode of the transistor and configured to control the state of the transistor in a main operating mode,
    an auxiliary control circuit, comprising:
        a first resistance in series between one of the other electrodes of the transistor and a transistor forming part of the element for detecting presence of a predetermined condition relating to a value of a time derivative of a current flowing between the electrodes of the transistor other than the control electrode, and
        a second resistance in series between said transistor forming part of the element for detecting the presence of the predetermined condition and a voltage source, the terminal of this second resistance connected to the transistor of the element for detecting the presence of the predetermined condition being additionally connected to the control electrode of a transistor through which the auxiliary current flows when the latter is injected, wherein the locking is achieved by the choice of the value of the ratio between the first and the second resistance,
    a power amplifier circuit, and
    an element for detecting the presence of the predetermined condition by measuring a voltage at the terminals of a parasitic inductance of one of the electrodes other than the control electrode of the transistor,
    the method comprising:
        injecting, by the auxiliary control circuit, in an auxiliary operating mode, an auxiliary current into the control electrode of the transistor to oppose the current flowing between the main control circuit and the control electrode of the transistor, wherein
        the power amplifier circuit, of a "push-pull" type, is positioned between the main control circuit and the control electrode of the transistor, the auxiliary control circuit being arranged so that the injected current flows through this power amplifier circuit when the auxiliary operating mode is used,
        the auxiliary operating mode being used when the predetermined condition is detected.

5. The method as claimed in claim 4, the transistor belonging to a branch of a static converter, said branch additionally comprising at least a switching cell in series with the transistor, wherein the predetermined condition makes it possible to determine whether the transistor is cut off when a short circuit has previously developed in the branch.

\* \* \* \* \*